United States Patent [19]

Matsuno

[11] Patent Number: 4,857,855
[45] Date of Patent: Aug. 15, 1989

[54] METHOD FOR COMPENSATING FOR PHASE OF INSULATION RESISTANCE MEASURING CIRCUIT

[75] Inventor: Tatsuji Matsuno, Kanagawa, Japan

[73] Assignee: Toyo Communication Equipment Co., Ltd., Tokyo, Japan

[21] Appl. No.: 266,697

[22] Filed: Nov. 3, 1988

[51] Int. Cl.⁴ .......................................... G01R 31/02
[52] U.S. Cl. ................................. 324/521; 324/551; 324/544; 324/522
[58] Field of Search ............... 324/509, 521, 522, 551, 324/541, 544, 527, 83 FE

[56] References Cited

U.S. PATENT DOCUMENTS

| | | | |
|---|---|---|---|
| 4,200,835 | 4/1980 | Anahara et al. | 324/541 |
| 4,422,034 | 12/1983 | Matsuno et al. | 324/541 |
| 4,472,676 | 9/1984 | Eichmann et al. | 324/509 |
| 4,638,242 | 1/1987 | Matsuno | 324/551 |
| 4,791,375 | 12/1988 | Kan | 324/522 |

FOREIGN PATENT DOCUMENTS

| | | | |
|---|---|---|---|
| 10666 | 1/1983 | Japan | 324/521 |
| 0186765 | 9/1985 | Japan | 324/551 |
| 43572 | 2/1987 | Japan | 324/551 |

Primary Examiner—Reinhard J. Eisenzopf
Assistant Examiner—Maura K. Regan
Attorney, Agent, or Firm—Spensley Horn Jubas & Lubitz

[57] ABSTRACT

A method for measuring an insulation resistance of an electric line is disclosed. A low frequency signal, which has the same frequency as a signal applied to the electric line and is in phase with the line applied signal or shifted by 90 degrees therefrom, is applied with the amplitude value being varied with a period T. A leakage current sent to synchronous detector is adjusted with respect to its phase or a reference signal is adjusted with respect to its phase to minimize (make zero) or maximize one of induced effective components or induced ineffective or reactive components of the leakage current having a frequency of 1/T.

4 Claims, 6 Drawing Sheets

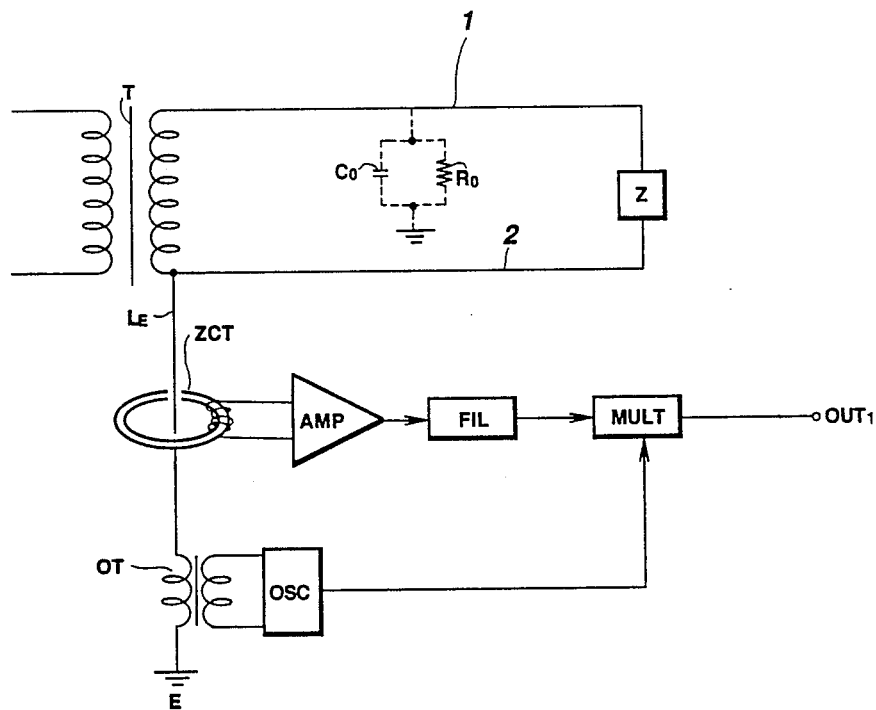
FIG.1 *(PRIOR ART)*
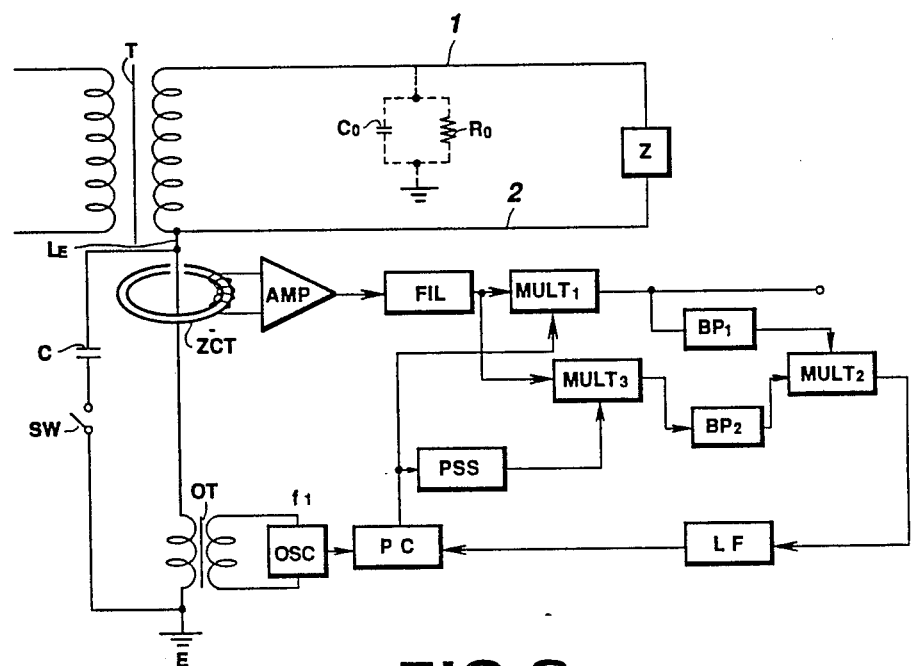
FIG.2

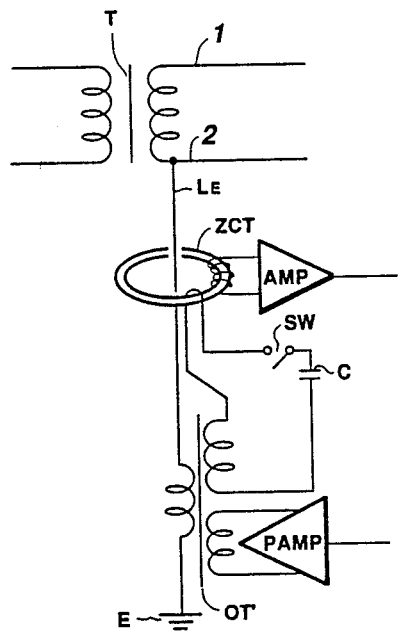
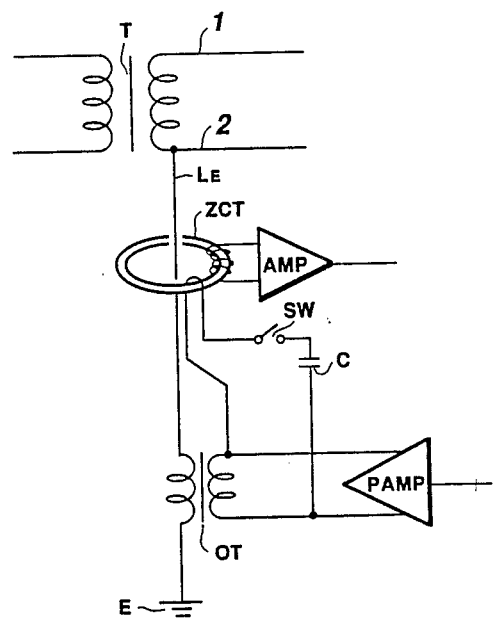
FIG.7(a)      FIG.7(b)
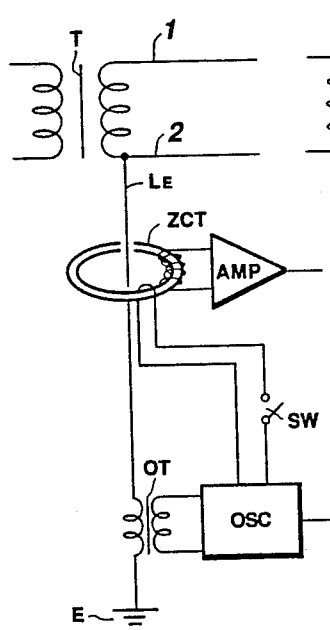
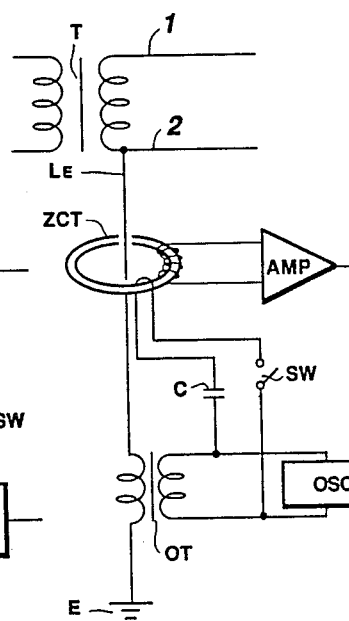
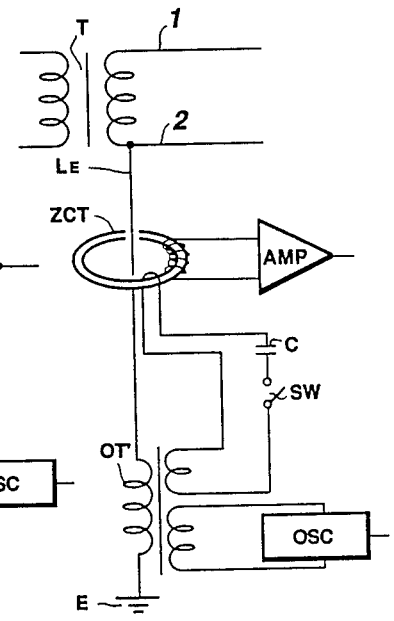
FIG.7(c)     FIG.7(d)     FIG.7(e)

METHOD FOR COMPENSATING FOR PHASE OF INSULATION RESISTANCE MEASURING CIRCUIT

BACKGROUND OF THE INVENTION

1. Field of the Invention

The present invention relates to a method of compensating for a phase in a circuit which measures the insulation resistance of an electric power transmission line, a grounding line for lightning protection or the like.

2. Description of the Related Art

There has been so far known in electric power transmission facilities such a measurement apparatus which monitors the insulation resistance between an electric line and the ground and detects the insulation deterioration of the line as fast as possible, thus preventing beforehand any trouble from occurring for the stable transmission of electric power. An example of such a measurement apparatus is given by an electric circuit in FIG. 1, which measures an insulation resistance $R_0$ between an electric line and the ground in the event where the electric power of a voltage stepped down by a transformer T is supplied or transmitted through electric lines 1 and 2 on of which is connected to the earth E through a grounding conductor $L_E$.

More specifically, the aforementioned circuit of FIG. 1 is arranged so that a transformer OT, which is connected to a low frequency signal oscillator OSC generating a measuring signal of a low frequency different from a commercial power source frequency, is inserted in the grounding line $L_E$ of the power receiving transformer T to apply a measuring low frequency voltage to the electric lines 1 and 2; a current transformer ZCT having the grounding line $L_E$ passed therethrough detects a leakage current of the aforementioned measuring low frequency signal that is fed back to the grounding conductor through the insulation resistance $R_0$ and an earth stray capacity $C_0$ existing between the electric lines and the earth; an amplifier AMP connected to the current transformer ZCT amplifies the detected leakage current; a filter FIL connected to the amplifier AMP extracts only a frequency $f_1$ component from the amplified signal; and a multiplier MULT synchronously detects the extracted component with use of, for example, an output signal of the oscillator OSC to detect an effective component ($OUT_1$) (that is, a component in phase with the applied low-frequency voltage) of the leakage current and to thereby measure the insulation resistance of the electric lines.

Explanation will next be made as to the measuring theory.

Assuming now that the measuring signal voltage applied to the grounding line $L_E$ is of a sine wave $V \sin \omega_1 t$ ($\omega_1 t = 2\pi f_1$), then a leakage current I of a frequency $f_1$ fed back to the grounding line $L_E$ through an earth point E is expressed by the following equation.

$$I = (V/R_0) \cdot \sin \omega_1 t + \omega_1 C_0 V \cos \omega_1 t \tag{1}$$

The leakage current I extracted by the current transformer ZCT and passed through the amplifier AMP and the filter FIL is synchronously detected by the multiplier MULT with the signal of the oscillator OSC in phase with the low-frequency signal applied to the electric lines to extract its effective component, i.e., the first term in the right side of the above equation (1). The effective component, which is inversely proportional to the insulation resistance $R_0$, can be used to find the insulation resistance of the electric lines. With such a prior art method of detecting at the zero-phase current transformer ZCT the leakage current fed back to the grounding line and extracting and outputting at the filter FIL the component having a frequency of $f_1$ from the leakage current, however, when the leakage current component of the frequency $f_1$ is shifted in phase through passage of a system comprising the zero-phase current transformer ZCT, the amplifier AMP and the filter FIL, it becomes impossible to calculate the value of the insulation resistance accurately. To avoid this, it has been conventionally used a phase shifter which adjusts with respect to phase one or both of the signal sent to the multiplier MULT, i.e., the signal sent from the low frequency oscillator OSC and the leakage current passed through the extracting filter FIL from the current transformer ZCT to thereby set or correct a phase difference between the both signals to be zero.

However, the prior art method has been defective in that the phase characteristics of the current transformer ZCT, filter FIL, phase shifter and so on vary with temperature variations, the deterioration of characteristics of used parts with age and so on, which results in that a phase error from the initial adjustment value takes place, thus making it impossible to provide a correct measurement result. To cope with the defect, there has been so far employed such a high quality of zero-phase current transformer, filter and the like that are very small in their characteristic variations to thereby minimize the influence due to the phase error. Even so, it has been impossible to completely eliminate the influence.

More in detail, if the leakage current component I of the frequency $f_1$ shown in the equation (1) is assumed to have a phase shift $\theta$ when passed through the system of the zero-phase current transformer ZCT, amplifier AMP and filter FIL, then the filter FIL produces such an output $I_1$ as follows.

$$I_1 = (V/R_0) \sin(\omega_1 t + \theta) + \omega_1 C_0 V \cos(\omega_1 t + \theta) \tag{2}$$

And the output $I_1$ is applied to a first input terminal of the multiplier MULT.

Assuming a voltage applied to a second input terminal of the synchronus detector is, for example, $a_0 \sin(\omega_1 t + \theta)$ of a constant amplitude, then an output or an effective component D of the multiplier MULT is expressed as follows.

$$\begin{aligned} D &= \overline{I_1 \times a_0 \sin(\omega_1 t + \theta_1)} \quad (3) \\ &= (Va_0/2R_0)\cos(\theta - \theta_1) - (\omega_1 C_0 V a_0/2)\sin(\theta - \theta_1) \end{aligned} \tag{4}$$

where ——— means to eliminate components of D above angular frequency $\omega_1$.

Hence, an output $D_0$ when $\theta = \theta_1$ is given as follows.

$$D_0 = Va_0/2R_0 \tag{5}$$

Since V and $a_0$ are constant, the output $D_0$ can be measured as a value inversely proportional to the insulation resistance $R_0$. Accordingly, an error E for the effective component D with respect to the output $D_0$ when the phase shift $(\theta - \theta_1)$ is not zero becomes:

$$E = (D_0 - D)/D_0 \quad (6)$$
$$= 1 - \cos(\theta - \theta_1) - \omega_1 C_0 R_0 \sin(\theta - \theta_1)$$

For example, when $\theta - \theta_1 = 1$ degree, $R_0 = 20$ $K\Omega$ and $C_0 = 5$ $\mu F$, $f_1 = 25$ Hz and $\omega_1 C_0 R_0 \approx 15.7$. This yields 27.4% of an error $\epsilon$ with a remarkably large measurement error.

It is an object of the present invention to provide a phase correcting method in an insulation resistance measuring apparatus, which eliminates the above defects in the prior art insulation resistance measuring method, and which can automatically correct a phase shift in a measurement signal inexpensively without the need for any expensive parts and can produce always a correct measurement result.

SUMMARY OF THE INVENTION

In accordance with the present invention, the above object is attained by providing the following arrangement.

According to an aspect of the present invention, there is provided a method of compensating for a phase of an insulation resistance measuring circuit for an electric line, in which a low frequency signal having a frequency $f_1$ different from a commercial frequency is applied to the electric line to be measured through a first transformer coupled to a grounding conductor of a voltage transformer of the electric line or to the electric line itself, a leakage current component of the low frequency signal fed back to the grounding conductor is extracted through the first transformer coupled to the grounding conductor or to the electric line and is then subjected to a synchronous detection to measure the insulation resistance between the one electric line and the earth; and which method is characterized by comprising the steps of varying a current value of a signal in phase with the low frequency signal or shifted by a phase of 90 degrees with respect to the low frequency signal at intervals of a period T or at intervals of a random period including the period T, causing the current to act on the leakage current component extracting means, calculating a product of components having a frequency of 1/T both contained in effective and ineffective components of the synchronous detection output, and controlling a phase of a signal applied to synchronous detecting means so that a DC component contained in the product output becomes maximum or minimum.

According to another aspect of the present invention, there is provided a method for compensating for a phase of an insulation resistance measuring circuit for an electric lines, in which a low frequency signal having a frequency $f_1$ different from a commercial frequency is applied to the electric line through a first transformer coupled to a grounding conductor of a voltage transformer of the electric line or to the electric line itself, a leakage current component of the low frequency signal fed back to the grounding conductor is extracted through the first transformer coupled to the grounding conductor or to the electric line and is then subjected to a synchronous detection to measure the insulation resistance between the electric line and the earth; and which method is characterized by comprising the steps of branching the low frequency signal, shifting the branched signal by a phase of 90 degrees, varying a current value of the phaseshifted signal at intervals of a period T or at intervals of a random period including the period T, causing the current to act on leakage current extracting means to extract a leakage current component, synchronously detecting the leakage current to obtain effective and ineffective components that are defined as fourth and fifth signals respectively, applying the fourth signal to one input terminal of a subtractor to detect a component of an output of the subtractor having a frequency of 1/T, synchronously detecting the component of the frequency 1/T with the signal of the repetition period T to obtain a sixth signal, adjusting a phase of a signal applied to a synchronous detector to obtain the fourth and fifth signals so that the sixth signal becomes close to zero, calculating at a multiplier a product of the sixth signal multiplied by a constant and the fifth signal, and applying an output of the multiplier to the other input terminal of the subtractor to obtain the output signal of the subtractor and to thus measure the insulation resistance of the electric line.

According to a further aspect of the present invention, there is provided a method for compensating for a phase of an insulation resistance measuring circuit for an electric line, in which a low frequency signal having a frequency $f_1$ different from a commercial frequency is applied to the electric line through a first transformer coupled to a grounding conductor of a voltage transformer of the electric line or to the electric line itself, a leakage current component of the low frequency signal fed back to the grounding conductor is extracted through the first transformer coupled to the grounding conductor or to the electric line and is then subjected to a synchronous detector to measure the insulation resistance between the electric line and the earth; which method is characterized by comprising the steps of branching the low frequency signal, shifting the branched signal by a phase of 90 degrees, varying a current value of the phase-shifted signal at intervals of a period T or at intervals of a random period including the period T, causing the current to act on leakage current extracting means to extract a leakage current component, synchronously detecting the leakage current to obtain effective and ineffective components that are defined as fourth and fifth signals respectively, detecting a component of an output of the fourth signal having a frequency of 1/T, synchronously detecting the component of the frequency 1/T with the signal of the repetition period T to obtain a seventh signal, multiplying a product of the seventh signal and the fifth signal by a constant to prepare a eighth signal, subtracting the eighth signal from the fourth signal to obtain a subtraction result, and calculating the insulation resistance of the electric line on the basis of the subtraction result.

BRIEF DESCRIPTION OF THE DRAWINGS

FIG. 1 is a block diagram of a prior art insulation resistance measuring circuit;

FIGS. 2, 3, 4, 5 and 6 show block diagrams of insulation resistance measuring circuits in accordance with different embodiments of the present invention, respectively;

FIGS. 7(a), 7(b), 7(c), 7(d) and 7(e) are diagrams for explaining different methods of causing a pulse signal turned ON and OFF at intervals of a period T to act on a leakage current detecting means, respectively.

DESCRIPTION OF THE PREFERRED EMBODIMENTS

Figure 3:
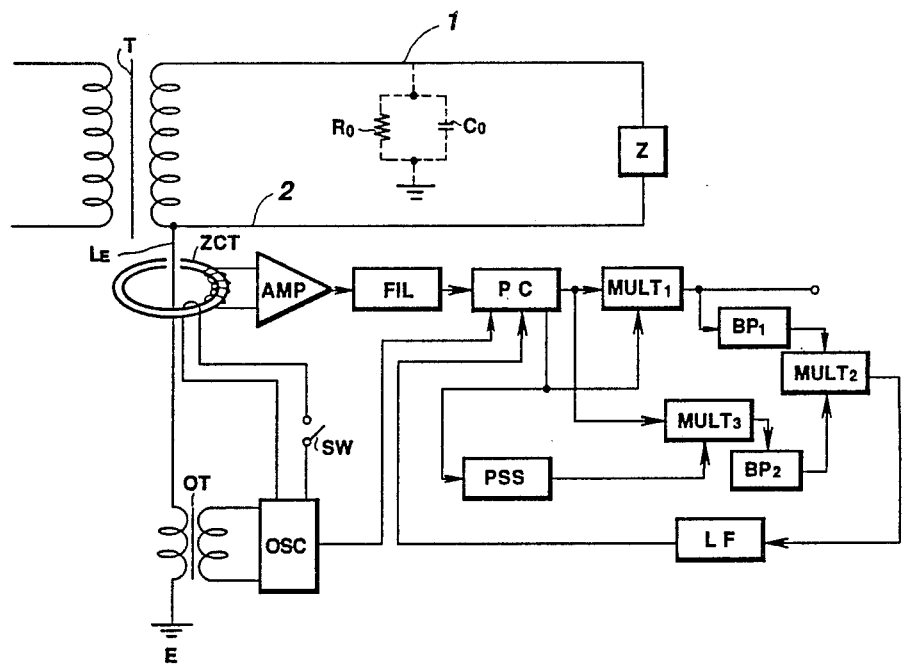

Referring to FIG. 2, there is shown a circuit diagram of a first embodiment of the insulation resistance measuring circuit in accordance with the present invention. In the drawing, as in FIG. 1, a low impedance transformer OT, which is coupled to an oscillator OSC for generation of a low frequency signal having a frequency $f_1$, is inserted in a grounding conductor $L_E$ in series therewith to apply the low frequency voltage signal V to electric lines 1 and 2, so that a current transformer ZCT coupled to the grounding conductor $L_E$, a filter FIL and a first multiplier $MULT_1$ as a synchronous detector will extract an in-phase (effective) component that is inversely proportional to the insulation resistance of the electric lines, from a leakage signal of the low frequency signal fed back to the grounding conductor $L_E$. The multiplier $MULT_1$ and the other multipliers described hereafter are used as synchronous detectors for synchronous detection. In the present embodiment, in addition to the prior art arrangement mentioned above, such an arrangement as follows is newly added.

That is, a series circuit of a capacitor C and a switch SW is provided between a junction point of the grounding conductor $L_E$ to the electric line 2 and a junction point of the conductor to the earth, and the switch SW is turned ON and OFF at intervals of a period T. In this case, an output of the low frequency oscillator OSC is applied to the first multiplier $MULT_1$ through an automatic phase-shift control circuit PC, and an output $D_1$ of the multiplier $MULT_1$ is applied to one input terminal of a multiplier or second synchronous detector $MULT_2$ through a first band pass filter $BP_1$ which allows the passage of only a signal having a frequency of 1/T.

Further, the input of the multiplier $MULT_1$, that is, a part of the output of the filter FIL is applied to one input terminal of a third multiplier $MULT_3$, an output of which detector is applied to the other input terminal of the multiplier $MULT_2$ through a second band pass filter $BP_2$ which allows the passage of only the signal having the frequency 1/T. An output of the multiplier $MULT_2$ is used to control the automatic phase-shift control circuit PC through a low pass filter LF, and the output of the circuit PC is partly applied through a 90° phase shifter PSS to the other input terminal of the third multiplier $MULT_3$.

Explanation will next be detailed about the operation of such an insulation resistance measuring circuit as arranged above as well as how to adjust the phase.

In FIG. 2, when the switch SW connected in parallel to the grounding conductor $L_E$ is turned ON, a current $\omega_1 CV \cos \omega_1 t$ flowing through the switch SW is added to the grounding conductor $L_E$, at which time a leakage current $I_0$ of the application low frequency component flowing through the grounding conductor is expressed as follows.

$$I_0 = (V/R_0) \sin \omega_1 t + \omega_1 C_0 V \cos \omega_1 t + \omega_1 CV \cos \omega_1 t \quad (7)$$

Taking into consideration a phase shift caused by a system of the zero-phase current transformer ZCT, amplifier AMP and filter FIL, an output $I_2$ of the filter FIL is written as follows, from the equation (2).

$$I_2 = (V/R_0)\sin(\omega_1 t + \theta) + \quad (8)$$
$$(C_0 + C)\omega_1 V \cos(\omega_1 t + \theta)$$

At this time, the output $D_1$ of the multiplier $MULT_1$ is expressed by the following equation, based on the equation (4).

$$D_1 = (Va_0/2R_0)\cos(\theta - \theta_1) - \quad (9)$$
$$[(C_0 + C)\omega_1 Va_0/2] \cdot \sin(\theta - \theta_1)$$

When the switch SW is now turned ON and OFF at intervals of the period T (in this embodiment, $T > 2\pi/\omega_1$), a C group contained in the second term of the equation (9) become repetitively absent and present with the period T, so that the multiplier $MULT_1$ produces a component of the frequency 1/T in the output $D_1$. (As will be appreciated from the equation (9), the 1/T frequency component cannot be produced since the second term becomes zero when $\theta = \theta_1$.) The application of the output $D_1$ of the multiplier $MULT_1$ to the filter $BP_1$ acting to extract only the 1/T frequency signal causes the filter $BP_1$ to produce such an output A as expressed by the following equation (10)

$$A = -kC\omega_1 Va_0 \sin(2\pi t/T + \phi) \sin(\theta - \theta_1) \quad (10)$$

where, k is a constant and $\phi$ is a phase determined by the characteristics of the filter and so on.

The output of the filter FIL is partly applied to the third multiplier $MULT_3$ which in turn receives at the other input terminal a synchronous signal obtained by passing the signal $a_0 \sin(\omega_1 t + \theta_1)$ to the first multiplier $MULT_1$ through the 90° phase shifter PSS, that is, the synchronous signal is expressed as follows.

$$D_2 = I_2 \times a_0 \cos(\omega_1 t + \theta_1) \quad (11)$$

This equation (11), like the earlier equation (3), means to remove components having angular frequencies above $\omega_1$, and thus can be rewritten as follows.

$$D_2 = (Va_0/2R_0)\sin(\theta - \theta_1) + \quad (12)$$
$$[\{\omega_1 Va_0 (C_0 + C)\}/2] \cdot \{\cos(\theta - \theta_1)\}$$

As has been already explained above in connection with the equation (9), a C group contained in the second term of the equation (12) becomes repetitively absent and present with the period T, so that the application of the output of the multiplier $MULT_3$ to the filter $BP_2$ acting to extract only the 1/T frequency signal can cause the filter $BP_2$ to produce such an output B as expressed by the following equation (13).

$$B = kC\omega_1 Va_0 \sin[(2\pi t/T) + \phi] \cdot \cos(\theta - \theta_1) \quad (13)$$

where k and $\phi$ are the same as those used in the equation (10). The multiplier $MULT_2$, when receiving the output B (expressed by the equation (13)) of the band pass filter $BP_2$ and the output A (expressed by the equation (10)) of the band pass filter $BP_1$, produces an output $D_3$.

$$D_3 = A \times B \tag{14}$$
$$= -(kC\omega_1 V a_0)^2 \sin^2[(2\pi t/T) + \phi] \cdot$$
$$\cos(\theta - \theta_1) \cdot \sin(\theta - \theta_1)$$
$$= -[(kC\omega_1 V a_0)^2/2] \cdot$$
$$\sin^2[(2\pi t)/T + \phi]\sin 2(\theta - \theta_1)$$
$$= -[(kC\omega_1 V a_0)^2/4] \cdot \sin 2(\theta - \theta_1) +$$
$$[(kC\omega_1 V a_0)^2/4] \cdot \cos 2[(2\pi t/T) + \phi]$$

Accordingly, the application of the output $D_3$ of the multiplier $MULT_2$ to the low pass filter LF will cause the filter LF to output a DC component signal $D_4$ which follows.

$$D_4 = -[(kC\omega_1 V a_0)^2/4] \cdot \sin 2(\theta - \theta_1) \tag{15}$$

Therefore, when the synchronous referernce signals $a_0 \sin(\omega_1 t + \theta_1)$ and $a_0 \cos(\omega_1 t + \theta_1)$ applied to the two multipliers $MULT_1$ and $MULT_3$ are adjusted with respect to the phase $\theta_1$ through the automatic phase control circuit PC so that the output $D_4$ of the low pass filter LF becomes zero, that is, $\theta = \theta_1$, the second term in the equation (9) of the output $D_1$ of the first multiplier $MULT_1$ can be made zero and thus an accurate detection signal can be obtained.

In this connection, the automatic phase adjusting circuit PC may be used so long as it can automatically adjust the phase of the output signal of the low frequency oscillator OSC to be supplied to the first and third multipliers $MULT_1$ and $MULT_3$ so that the DC component signal $D_4$ becomes zero that is obtained through two loops in FIG. 2, that is, through the first multiplier $MULT_1$, first band pass filter $BP_1$, multiplier $MULT_2$ and low pass filter LF, as well as through the 90° phase shifter PSS, third multiplier $MULT_3$, second band pass filter $BP_2$, multiplier $MULT_2$ and low pass filter LF. Such an automatic phase adjusting circuit can be easily realized by those skilled in the art by known techniques and thus explanation thereof is omitted.

Referring to FIG. 3, there is shown a block diagram of another embodiment of the present invention, in which a 90° phase-shifted signal is derived directly from a low frequency oscillator OSC and applied through a switch SW to a signal line passing through a zero-phase current transformer ZCT and an automatic phase control circuit PC is connected to one input terminal of a first multilier $MULT_1$ in order to apply a low frequency signal obtained by shifting the low frequency signal of the oscillator OSC by a phase of 90°, to a system of detecting a leakage current fed back to the grounding conductor. Even with such an arrangement, when the automatic phase control circuit PC is controlled so that the output of the low pass filter LF becomes zero as in FIG. 2, the insulation resistance of the electric lines can be similarly measured accurately.

Figure 4:
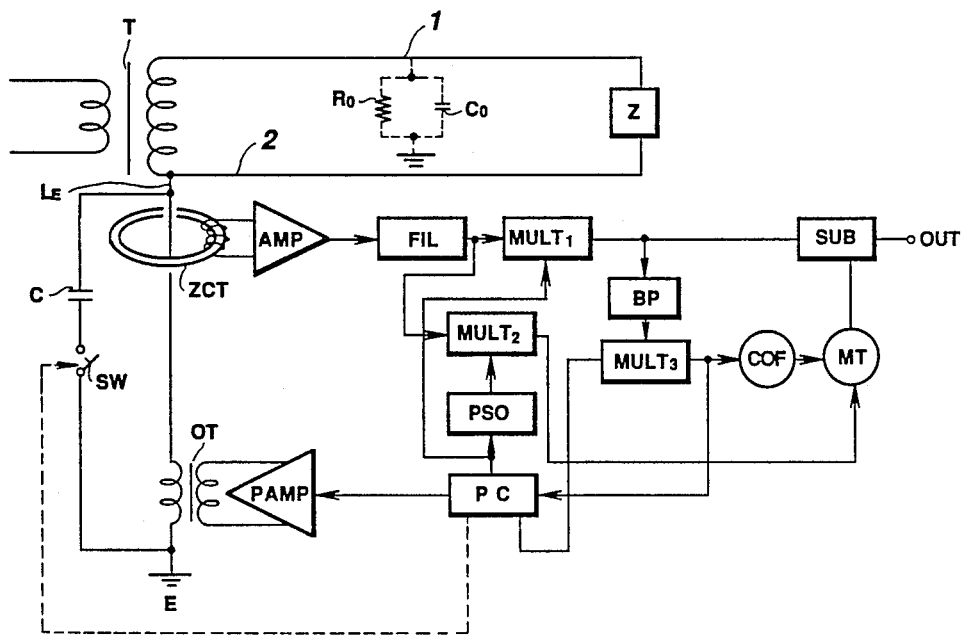

The present invention may be modified as shown in FIG. 4. More in detail, FIG. 4 is a circuit diagram showing another embodiment of a method of compensating for the phase of an insulation resistance measuring circuit in accordance with the present invention. In the illustrated measuring circuit, a low frequency voltage of a frequency $f_1$ generated at a phase control circuit PC is amplified at a power amplifier PAMP having small variations in its phase characteristics and then applied, as a voltage $V \sin \omega_1 t$, through a transformer OT to a grounding conductor $L_E$ and then to electric lines 1 and 2. In this case, the output impedance of the transformer OT inserted in the grounding conductor $L_E$ in series therewith is selected to be sufficiently low. Coupled also to the grounding conductor $L_E$ is a current transformer ZCT the output of which is applied to a filter FIL which acts to pass a component of its input signal having the frequency $f_1$ and eliminate a commercial frequency component thereof. As a result, the filter FIL produces an output corresponding to the equation (2) which output is applied to first input terminals of two multipliers $MULT_1$ and $MULT_2$ respectively.

A series circuit of a capacitor C and a switch SW is connected to the grounding conductor $L_E$ in parallel thereto so that the phase control circuit PC controls the opening and closing operations of the switch SW.

Applied to the other input terminals of the two multipliers $MULT_1$ and $MULT_2$ respectively is an output of the low frequency $f_1$ of the phase control circuit PC, but the low frequency $f_1$ output of the circuit PC is applied through a 90° phase shifter PSO to the other input terminal of the multiplier $MULT_2$, that is, with the low frequency $f_1$ output shifted by a phase of 90 degrees.

Among outputs of the two multipliers $MULT_1$ and $MULT_2$, the output of the multiplier $MULT_1$ is divided into two one of which is applied to one input terminal of a subtractor SUB and the other of which is applied through a filter BP to a third multiplier $MULT_3$ as its comparison signal.

Applied as its reference signal to the third multiplier $MULT_3$ is a switching signal output of the phase control circuit PC.

An output of the multiplier $MULT_3$ is partially applied through a coefficient circuit COF to a multiplier MT where the input signal is multiplied by an output of the multiplier $MULT_2$ to produce a resultant multiplication output. The multiplication output is applied to the other input terminal of the subtractor SUB which in turn produces a desired signal OUT.

The switch SW in the series circuit of the capacitor C and the switch SW connected in parallel to the grounding conductor $L_E$ is so arranged that the ON and OFF operations are controlled by the phase control circuit PC.

In the operation of the circuit of FIG. 4, substantially similarly to the circuit of FIG. 2, when the switch SW is turned ON, a current $I_0$ flowing through the grounding conductor is expressed by the equation (7), an output $I_2$ of the filter FIL is by the equation (8), an ouptut $D_1$ of the multiplier $MULT_1$ is by the equation (9), and an output A of the filter BP is by the equation (10), respectively.

When the output A of the filter BP is then applied to one input terminal of the third multiplier $MULT_3$ and a repetition signal of the period T as one output signal of the phase control circuit PC acting to turning ON and OFF the switch SW is applied to the other input terminal of the multiplier $MULT_3$, the multiplier $MULT_3$ produces such an output $S_0$ as expressed by the following equation.

$$S_0 = \overline{A \times \sin(2\pi t/T)} \tag{16}$$

And the equation (16) is further rewritten as follows.

$$S_0 = -k_0 \cos \phi \cdot \sin(\theta - \theta_1) \tag{17}$$

where $k_0$ is equal to a constant $kC\omega_1Va_0/2$. in the case where $|\phi|<\pi/2$ and $|\theta-\theta_1|<\pi/2$, and if $\theta>\theta_1$ then $S_0<0$, if $\theta\leq\theta_1$ then $S_0\geq 0$. Accordingly, the phase control circuit PC receiving the phase control signal $S_0$ can discriminate the phase adjustment direction on the basis of the signal $S_0$ and thus can approach $(\theta-\theta_1)$ to zerp by controlling the phase $\theta_1$ so that the signal $S_0$ becomes zero.

If the voltage applied to the second input terminal of the multiplier MULT$_2$, which corresponds to the voltage $a_0\sin(\omega_1 t+\theta_1)$ applied to the second input terminal of the multiplier MULT$_1$ but shifted by a phase of 90° degrees, is expressed by $a_0\cos(\omega_1 t+\theta_1)$, then an output H of the multiplier MULT$_2$ with the switch SW turned OFF is represented by the following equation.

$$H = \overline{I_1 \times a_0\cos(\omega_1 t + \theta_1)} \quad (18)$$
$$= [\omega_1 C_0 Va_0\cos(\theta - \theta_1)]/2 + [Va_0\sin(\theta - \theta_1)]/2R_0$$

When the switch is turned ON, on the other hand, the multiplier MULT$_2$ produces an output $H_2$ which follows.

$$H_2 = [\omega_1(C_0 + C)Va_0\cos(\theta - \theta_1)]/2 + \quad (19)$$
$$[Va_0\sin(\theta - \theta_1)]/2R_0$$

When the output $S_0$ of the multiplier MULT$_3$ is multiplied at the coefficient circuit COF by, for example, $1/K_0 \cos\phi$, the coefficient circuit COF generates an output $-\sin(\theta-\theta_1)$ (since $K_0$ and $\cos\phi$ can be thought to be constants respectively as mentioned above). Therefore, when the multiplier MT calculates a product of the output of the multiplier MULT$_2$ and the output of the coefficient circuit COF and the subtractor SUB performs a subtraction between the product and the output $D_1$ of the multiplier MULT$_1$, the subtractor SUB with the switch SW turned OFF generates an output OUT$_1$ which follows.

$$OUT_1 = D + H \cdot \sin(\theta - \theta_1) \quad (20)$$
$$= [Va_0\{\cos(\theta - \theta_1) + \sin^2(\theta - \theta_1)\}]/2R_0 +$$
$$[\omega_1 C_0 Va_0\sin(\theta - \theta_1)\{\cos(\theta - \theta_1) - 1\}]/2$$

When the switch SW is turned ON, on the other hand, an output OUT$_2$ of the subtractor SUB is written as given below, according to the equations (9) and (14).

$$OUT_2 = D_1 + H_2\sin(\theta - \theta_1) \quad (21)$$
$$= [Va_0\{\cos(\theta - \theta_1) + \sin^2(\theta - \theta_1)\}]/2R_0 +$$
$$[\omega_1(C_0 + C)Va_0\sin(\theta - \theta_1)\{\cos(\theta - \theta_1) - 1\}]/2$$

If the phase $\phi_1$ is adjusted in the aforementioned manner so that $|\theta-\theta_1|<1$, then $\sin(\theta-\theta_1)\cong(\theta-\theta_1)$, $\cos(\theta-\theta_1)\cong 1$ and $\sin^2(\theta-\theta_1)\cong 0$. Hence, the output OUT expressed by the equation (15) or (16) becomes:
$$OUT\cong Va_0/2R_0 \quad (22)$$

In the case where the output of the multiplier MULT$_1$ is merely used as in the prior art, it becomes as follows from the equation (4) when $|\theta-\theta_1|<1$ and the switch SW is turned OFF.

$$D\cong Va_0/2R_0 - [\omega_1 C_0 Va_0(\theta-\theta_1)]/2 \quad (23)$$

When the switch is turned ON, the output of the detector MULT$_1$ is from the equation (9):

$$D_1\cong Va_0/2R_0 - [\omega_1(C_0+C)Va_0\cdot(\theta-\theta_1)]/2 \quad (24)$$

It will be seen from this equation that, when an electrostatic capacity $C_0$ with respect to the earth is large under the influence of the phase error $(\theta-\theta_1)$, the error becomes larger than the output OUT expressed by the equation (17) unless the error $(\theta-\theta_1)$ is sufficiently reduced.

Although the phase control signal $S_0$ has been used for the phase adjustment in the foregoing embodiment, the phase control signal may be replaced by such a signal as will be explained below.

That is, there may be employed a signal which corresponds to a product of the signal $S_0$ and a signal obtained by detecting a component of the output of the multiplier MULT$_2$ having a frequency 1/T through a separately provided filter and by subjecting the detected component signal to another synchronous detection with use of the aforementioned signal of the repetition period T. Alternatively, there may be used a DC signal which is obtained by detecting components having the frequency 1/T contained in the outputs of the multipliers MULT$_1$ and MULT$_2$, by calculating a product of the detected components and by finding the DC component of the product signal, with substantially the same results as in the foregoing embodiment (the detiled explanation of which is omitted).

Figure 5:
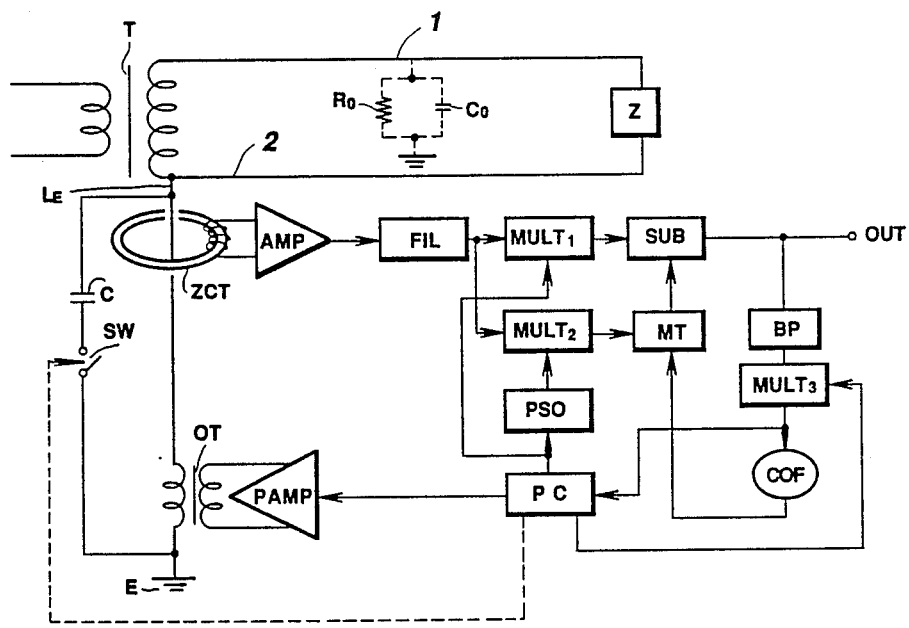

The present invention may further be modified as shown is FIG. 5. More specifically, FIG. 5 is a block diagram showing another embodiment of the present invention. The present embodiment of FIG. 5 is the same as that of FIG. 4 in that a signal having a frequency f, is applied to a grounding conductor $L_E$ and a leakage current is extracted through a current transformer ZCT coupled to the grounding conductor $L_E$ so that the extracted signal is applied through a filter FIL to two multipliers MULT$_1$ and MULT$_2$ to extract effective and ineffective components therefrom. However, the circuit of FIG. 5 is different from that of FIG. 4 in that the circuit of FIG. 5 calculates a subtraction between components of the frequency 1/T contained in the outputs of the first and second multipliers MULT$_1$ and MULT$_2$, or in other words, in that only a relative interconnection position of the subtractor SUB and band pass filter BP is different between FIG. 4 and FIG. 5. That is, the basic principles of circuits of FIG. 4 and FIG. 5 are substantially the same. Thus, the explanation of FIG. 5 is not detailed but merely summarized.

In FIG. 5, when a switch SW is turned ON, a leakage current $I_o$ is expressed by the equation (7), an output $I_2$ of a filter FIL is by the equation (8), an output $D_1$ of a first multiplier MULT$_1$ is by the equation (9), an output H or $H_2$ of a second multiplier MULT$_2$ is by the equation (18) or (19), respectively.

As has been explained, in the present embodiment, the outputs of the first and second multipliers MULT$_1$ and MULT$_2$ are applied to a subtractor SUB and a multiplier MT respectively and an output of the multiplier MT is applied to the other input terminal of the subtractor SUB. An output of the subtractor SUB is supplied to the other input terminal of the multiplier MT through a filter BP allowing the passage of a component of the input signal having a frequency 1/T, a third multiplier MULT$_3$ and a coefficient circuit COF, thus forming a loop. For the purpose of facilitating the explanation of the operation of this system, it is assumed that the coefficient circuit COF produces an output x. Then an output OUT of the subtractor SUB corresponds to a difference between the output D$_1$ of the first multiplier MULT$_1$ and the output of the second multiplier MULT$_2$ multiplied by x. Accordingly, the output OUT$_1$ of the subtractor SUB when the switch SW is turned OFF is represented by the following equation, according to the equations (4) and (18).

$$\begin{aligned} OUT_1 &= [Va_0\omega_s(\theta - \theta_1)]/2R_0 - [\omega_1 C_0 Va_0 \sin(\theta - \theta_1)]/2 - \\ &\quad x\{[\omega_1 C_0 Va_0 \omega_s(\theta - \theta_1)]/2 + \\ &\quad [Va_0 \sin(\theta - \theta_1)]/2R_0\} \\ &= [Va_0\{\cos(\theta - \theta_1) - x\sin(\theta - \theta_1)\}]/2R_0 - \\ &\quad [\omega_1 C_0 Va_0 \{\sin(\theta - \theta_1) + x\cos(\theta - \theta_1)\}]/2 \end{aligned} \quad (25)$$

When the switch SW is turned ON, on the other hand, an output OUT$_2$ of the subtractor SUB is expressed as follows according to the equations (9) and (19).

$$\begin{aligned} OUT_2 &= [Va_0\{\cos(\theta - \theta_1) - x\sin(\theta - \theta_1)\}]/2R_0 - \\ &\quad [\omega_1(C_0 + C)Va_0\{\sin(\theta - \theta_1) + x\cos(\theta - \theta_1)\}]/2 \end{aligned} \quad (26)$$

Hence, when the switch SW is turned ON and OFF at intervals of the period T as in FIG. 4, the filter BP produces an output A can be expressed by the following equation, according to the equations (25) and (26).

$$\begin{aligned} A &= -kC\omega_1 Va_0 \sin(2\pi t/T + \phi) \cdot \\ &\quad \{\sin(\theta - \theta_1) + x \cdot \cos(\theta - \theta_1)\} \end{aligned} \quad (27)$$

where k is a constant and $\phi$ is a pahse determined by the characteristics of the filter BP and so on.

When the output A of the filter BP is applied to one input terminal of the third multiplier MULT$_3$ and a repetition signal of the period T acting to turning ON and OFF the switch SW is applied to the other input terminal of the third multiplier MULT$_3$, an output S$_o$ of the third multiplier MULT$_3$ is:

$$S_o = \overline{A \times \sin(2\pi t/T)} \quad (28)$$

The substitution of the equation (14) yields the following components having frequencies below 1/T.

$$= -k_0\{\sin(\theta - \theta_1) + x \cdot \cos(\theta - \theta_1)\} \quad (29)$$

where k$_o$ is expressed as follows.

$$k_o = (kC\omega_1 Va_0 \cos\phi)/2 \quad (30)$$

The quantity x is defined as an output corresponding to the output S$_o$ of the multiplier MULT$_3$ multifited by 1/k$_o$ of the coefficient circuit COF, as mentioned above. So that the quantity x is as follows.

$$x = -\{\sin(\theta - \theta_1) + x \cdot \cos(\theta - \theta_1)\} \quad (31)$$

Solving the equation (31) for x gives:

$$x = -[\sin(\theta - \theta_1)]/[1 + \cos(\theta - \theta_1)] \quad (32)$$

Thus, the output S$_o$ of the multiplier MULT$_3$ is rewritten according to the equation (16), as follows.

$$S_o = -k_o[\sin(\theta - \theta_1)]/[1 + \cos(\theta - \theta_1)] \quad (33)$$

As a result, in the case where $|\phi| < \pi/2$ and $(\theta - \theta_1) < \pi/2$, if $\theta > \theta_1$ then $S_o < 0$ and $\theta \leq \theta_1$ then $S_o < 0$, so that the use of the output S$_o$ enables the discrimination of the adjustment direction of the phase $\theta_1$, that is, when the output S$_o$ is applied to the phase control circuit PC to adjust the phase $\theta_1$ and to approach the S$_o$ to zero, the phase $(\theta - \theta_1)$ can be reduced to zero. The phase control circuit PC can be realized by those skilled in the art by known techniques and thus explanation thereof is omitted.

Since the switch SW turned OFF causes the subtractor SUB to produce such an output OUT, as expressed by the equation (25), the substitution of the quantity x of the equation (32) into the equation (25) results in:

$$\begin{aligned} OUT_1 &= Va_0/2R_0 - [\omega_1 C_0 Va_0/2] \cdot \\ &\quad [\sin(\theta - \theta_1)/\{1 + \cos(\theta - \theta_1)\}] \end{aligned} \quad (34)$$

When the switch SW is turned ON, on the other hand, the subtractor SUB produces an output OUT$_2$ according to the equation (26).

$$\begin{aligned} OUT_2 &= Va_0/2R_0 - [\omega_1(C_0 + C)Va_0/2] \cdot \\ &\quad [\sin(\theta - \theta_1)/\{1 + \cos(\theta - \theta_1)\}] \end{aligned} \quad (35)$$

Hence, if $|\theta - \theta_1| << 1$ then $\sin(\theta - \theta_1) \cong (\theta - \theta_1)$ and $\cos(\theta - \theta_1) \cong 1$, so that the outputs OUT$_1$ and OUT$_2$ are rewritten as follows.

$$OUT_1 \rightarrow Va_0/2R_0 - [\omega_1 C_0 Va_0/2] \cdot [(\theta - \theta_1)/2] \quad (36)$$

$$\begin{aligned} OUT_2 &\rightarrow Va_0/2R_0 - \\ &\quad [\omega_1(C_0 + C)Va_0/2] \cdot [(\theta - \theta_1)/2] \end{aligned} \quad (37)$$

In the case where only the output of the multiplier MULT$_1$ is merely used as in the prior art, if $|\theta - \theta_1| << 1$ and the switch SW is turned ON, then the output D of the detector MULT$_1$ is expressed as follows, according to the equation (4).

$$D \rightarrow Va_0/2R_o - [\omega_1 C_o Va_0/2] \cdot (\theta - \theta_1) \quad (38)$$

Similarly, when the switch SW is turned ON, the output D$_1$ of the multiplier MULT$_1$ is according to the operation (9):

$$\begin{aligned} D_1 &\rightarrow Va_0/2R_0 - \\ &\quad [\omega_1(C_0 + C)Va_0/2] \cdot (\theta - \theta_1) \end{aligned} \quad (39)$$

It will be appreciated from the foregoing explanation that the prior art using only the output of the multiplier MULT$_1$ is adversely affected by the phase error $(\theta - \theta_1)$ twice as much as the present invention method. That is, in the present invention, the use of the output OUT of the subtractor SUB through the operation mentioned above enables the accurater measurement of the value $Va_o/2R_o$ inversely proportional to the insulation resistance of the electric lines when compared with the prior art.

Figure 6:
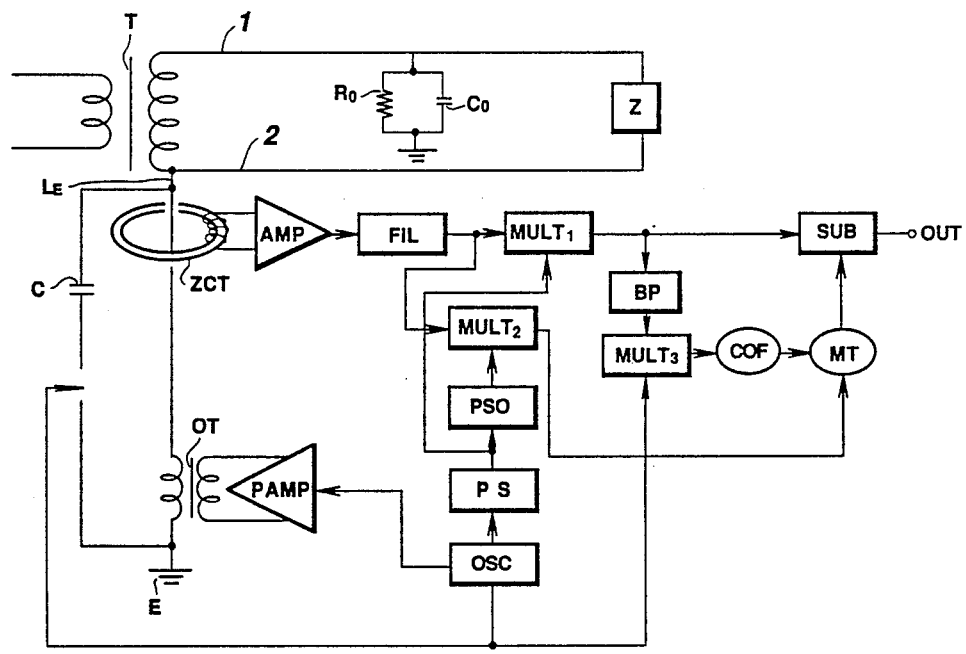

FIG. 6 is a modification of the circuit of FIG. 4 embodying the present invention method. The circuit of FIG. 6 is different from that of FIG. 4 only in that, with respect to the circuit arrangement, a phase shifter PS is located between a phase shifter PSO acting to shift the phase of a signal to be applied to a second multiplier MULT$_2$ and a oscillator OSC (corresponding to the phase control circuit PC in FIG. 4).

Further, FIG. 6 is different from FIG. 4 in that, with respect to the control method, the phase of the signal to be applied to the third multiplier MULT$_3$ is adjusted so that the output (the sixth signal) of the third multiplier MULT$_3$ becomes close to zero, the product of the phase-adjusted signal and the ineffective component (the fifth signal) of the leakage current is calculated, and the product signal is subtracted from the effective component of the leakage current, in the embodiment of FIG. 4; whereas, the similr calculations are carried out while the aforementioned sixth signal is not made close to zero, in the embodiment of FIG. 6. In addition, in FIG. 6, the output of the low freequency oscillator OSC is applied through the phase shifter PS to the second phase shifter PSO which in turn supplies its output to the second multiplier MULT$_2$. In the present method, since the initial phase shift can be previously corrected by the phase shifter PS, it is required to correct only the subsequent phase shift caused by variations in the temperature and the deterioration with age, whereby the necessary compensation or correction time can be reduced and the accuracy can be improved.

In this connection, computation equations used in the pressent embodiment are substantially the same as those used in the embodiment of FIG. 4 and thus explanation thereof is omitted.

The present invention is not limited to the foregoing particular embodiments and may be modified in various ways.

For example, in order to cause a signal turned ON and OFF at intervals of the period T to act on a leakage current extracting means, such various methods embodied as shown in FIGS. 7 (a), (b), (c) (d) and (e) can be considered.

Figure 8A:
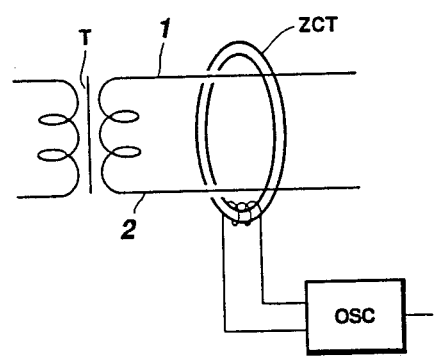
FIGS. 8(a) and 8(b) show other means for applying a measurement signal to electric lines and extracting a leakage current therefrom, respectively.
Figure 8B:
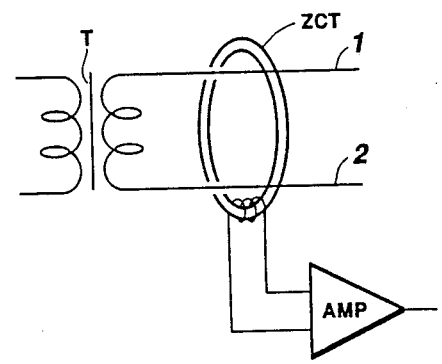

In order to apply a measurement signal to electric lines and extract a leakage current therefrom, such a current transformer may be coupled directly to electric lines as shown, for example, in FIG. 8(a) and (b).

Although the capacitor C has been merely turned ON and OFF at intervals of the period T in the foregoing embodiments, the foregoing phase control method may be applied even to the case where the value of the capacitor C is varied continuously (for example, sinusoidally). In this connection, a varicap element or a combination circuit of a coil and a capacitor may be used in place of the capacitor C.

The above phase adjustment may be intermittently carried out as by performing the above phase adjustment for a certain fixed duration, by fixing the $\theta_1$ when $\theta - \theta_1 = 0$ and then by again performing the phase adjustment randomly after the fixed duration.

The above explanation has been made as to the case where the capacitor C is inserted between the grounding electric line and the earth, but the present invention is not restricted to the particular example and the capacitor may be inserted, for example, between the nongrounding electric line and the earth. In this case, however, the voltage of the commercial power source is applied to the capacitor C and thus a remarkably large current flows through the capacitor C and the switch SW, for which reason these elements must be able to withstand such a large current.

In actual applications, the insertion of the capacitor C between the electric line and the earth involves the insertion of a somewhat small resistance component of wiring lines connecting the capacitor to the electric line and earth in series with the capacitor C. In this case, the small resistance component causes the current flowing through the capacitor C not to be shifted exactly by a phase of 90 degrees with respect to the application low-frequency voltage, thus involving an error though it is very small. However, this error is as very small as negligible in general measurements.

Although the voltage applied to the capacitor C has been expressed by V in the equation (7), the voltage is not limited to the particular example and may be any form of voltage without any operational troubles.

When it is previously adjusted to mutually shift the phases of two synchronization signals to be applied to the first and third multipliers MULT$_1$ and MULT$_3$ from the automatic phase control circuit PC exactly by a phase of 90 degrees and to make zero the output of the low pass filter, and further when a phase shift later caused by variations in the temperature, deterioration with age and so on is compensated for by the aforementioned automatic phase control method, the time duration necessary for the phase synchronization can be shortened. In addition, although explanation has been made as to the single-phase, 2-wire electric lines in the foregoing embodiments, the present invention may be similarly applied not only to single-phase, 3-wire electric lines and 3-phase, 3-wire electric lines grounded at one end of its lower voltage side, but also to such an electric line grounded at its one end as, for example, a lightning prevention conductor.

The above explanation has been made as to the case where the 90° phase shift signal applied to the leakage current extracting system is turned ON and OFF at intervals of the period T, but the ON and OFF timing may be modified in various manners.

For example, such ON and OFF operations can be repeated at all times and the automatic phase control circuit can be operated so as to always monitor the DC component of the low pass filter LF and to make the DC component zero or minimum.; or such ON and OFF operations can be done intermittently with a predetermined interval; or the ON and OFF operations can be repeated at random intervals including the frequency component 1/T to repeat the phase adjusting operations. However, other methods may be employed as a matter of course.

As has been disclosed in the foregoing, in accordance with the present invention, automatic phase adjustment can be realized in response to a variation in the phase characteristics of an insulation resistance measuring circuit. As a result, the present invention can realize a highly stable measuring method with remarkable effects.

What is claimed is:

1. A method of compensating for a phase of an insulation resistance measuring circuit for an electric line, in which a low frequency signal having a frequency f$_1$ different from a commercial frequency is applied to said electric line to be measured through a first transformer coupled to a grounding conductor of a voltage transformer of the electric line or to the electric line, a leakage current component of said low frequency signal fed back to said grounding conductor is extracted through a second transformer coupled to the grounding conductor or to the electric line and is then applied to a first input of synchronous detecting means to measure said insulation resistance between the one electric line and the earth; said method comprising the steps of:

varying a current value of a signal in phase with said low frequency signal or shifted by a phase of 90 degrees with respect to the low frequency signal at intervals of a period T or at intervals of a random period including said period T:

causing said current to act on leakage current component extracting means;

calculating a product of components having a frequency of 1/T both contained in effective and ineffective components of said synchronous detection output; and controlling a phase of a signal applied to a second input of said synchronous detecting means so that a DC component contained in said product output becomes maximum or minimum.

2. A phase compensation method as set forth in claim (1), wherein a signal of a frequency 1/T extracted from an effective component obtained by synchronously detecting said leakage current is defined as a first signal, an effective component signal obtained by synchronously detecting said first signal is defined as a second signal, the phases of signals applied to respective synchronous detecting means are adjusted so that said second signal becomes close to zero, an ineffective component obtained by synchronously detecting said leakage current is defined as a third signal, a value of a product of said second and third signals is multiplied by a constant, and said multiplied signal is subtracted from said first signal to measure said insulation resistance of said electric lines.

3. A method for compensating for a phase of an insulation resistance measuring circuit for an electric lines, in which a low frequency signal having a frequency $f_1$ different from a commercial frequency is applied to said electric line through a first transformer coupled to a grounding conductor of a voltage transformer of the electric line or to the electric line, a leakage current component of said low frequency signal fed back to said grounding conductor is extracted through a second transformer coupled to the grounding conductor or to the electric line and is then applied to a first input of a synchronous detecting means to measure said insulation resistance between the electric line and the earth; said method comprising the steps of:

branching said low frequency signal;

shifting said branched signal by a phase of 90 degrees;

varying a current value of said phase-shifted signal at intervals of a period T or at intervals of a random period including said period T;

causing said current to act on leakage current extracting means to extract a leakage current component;

synchronously detecting said leakage current to obtain effective and ineffective components that are defined as fourth and fifth signals respectively;

applying said fourth signal to one input terminal of a subtractor to detect a component of an output of said subtractor having a frequency of 1/T;

synchronously detecting said component of the frequency 1/T with said signal of the repetition period T to obtain a sixth signal;

adjusting a phase of a signal applied to a second input of said synchronous detecting means to obtain said fourth and fifth signals so that said sixth signal becomes close to zero;

calculating at a multiplier a product of said sixth signal multiplied by a constant and said fifth signal; and applying an output of said multiplier to the other input terminal of said subtractor to obtain the output signal of said subtractor and to thus measure said insulation resistance of the electric line.

4. A method for compensating for a phase of an insulation resistance measuring circuit for an electric lines, in which a low frequency signal having a frequency $f_1$ different from a commercial frequency is applied to said electric line through a first transformer coupled to a grounding conductor of a voltage transformer of the electric line or to the electric line, a leakage current component of said low frequency signal fed back to said grounding conductor is extracted through a second transformer coupled to the grounding conductor or to the electric line and is then applied to a first input of a synchronous detecting means to measure said insulation resistance between the electric line and the earth; said method comprising the steps of:

branching said low frequency signal;

shifting said branched signal by a phase of 90 degrees;

varying a current value of said phase-shifted signal at intervals of a period T or at intervals of a random period including said period T;

causing said current to act on leakage current extracting means to extract a leakage current component;

synchronously detecting said leakage current to obtain effective and ineffective components that are defined as fourth and fifth signals respectively;

detecting a component of an output of said fourth signal having a frequency of 1/T;

synchronously detecting said component of the frequency 1/T with said signal of the repetition period T to obtain a seventh signal;

multiplying a product of said seventh signal and said fifth signal by a constant to prepare a eighth signal;

subtracting said eighth signal from said fourth signal to obtain a subtraction result; and calculating said insulation resistance of the electric line on the basis of said subtraction result.

* * * * *